(12) United States Patent
Hamashima et al.

(10) Patent No.: US 6,365,897 B1
(45) Date of Patent: Apr. 2, 2002

(54) ELECTRON BEAM TYPE INSPECTION DEVICE AND METHOD OF MAKING SAME

(75) Inventors: Muneki Hamashima, Urayasu; Akihiro Goto, Setagaya-ku; Hiroshi Nishimura, Zushi, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/216,598

(22) Filed: Dec. 18, 1998

(30) Foreign Application Priority Data

Dec. 18, 1997 (JP) ............................................. 9-349446

(51) Int. Cl.$^7$ ................................................ H01J 37/26
(52) U.S. Cl. ........................................................... 250/310
(58) Field of Search ................................. 250/310, 306, 250/307, 397

(56) References Cited

U.S. PATENT DOCUMENTS

| | | | |
|---|---|---|---|
| 3,937,959 A | 2/1976 | Namae | 250/311 |
| 4,038,543 A | 7/1977 | Krisch et al. | 250/307 |
| 4,179,609 A | 12/1979 | Sewell et al. | 250/397 |
| 4,426,584 A | 1/1984 | Bohlen et al. | 250/492.2 |
| 4,504,558 A | 3/1985 | Bohlen et al. | 430/30 |
| 4,514,638 A | 4/1985 | Lischke et al. | 250/492.2 |
| 4,572,965 A | 2/1986 | Yamamura | 307/130 |
| 4,629,898 A | 12/1986 | Orloff et al. | 250/396 |
| 4,654,506 A | 3/1987 | Sakamoto et al. | 219/121 |
| 4,677,351 A | 6/1987 | Brust et al. | 315/386 |
| 4,684,809 A | 8/1987 | Nakasuji | 250/492.2 |
| 4,831,255 A | 5/1989 | Krivanek | 250/305 |
| 4,861,991 A | 8/1989 | Michener | 250/310 |
| 4,893,009 A | 1/1990 | Kuroda | 250/310 |
| 4,975,578 A | 12/1990 | Tomimasu et al. | 250/306 |
| 4,990,778 A | 2/1991 | Norioka | 250/310 |
| 4,998,020 A | 3/1991 | Misaka et al. | 250/492.2 |
| 5,153,434 A | 10/1992 | Yajima et al. | 250/311 |
| 5,298,747 A | 3/1994 | Ichikawa et al. | 250/306 |
| 5,313,062 A | 5/1994 | Yamada | 250/310 |
| 5,449,916 A | 9/1995 | Smyth et al. | 250/398 |
| 5,498,874 A | 3/1996 | Miyoshi et al. | 250/397 |
| 5,502,306 A | 3/1996 | Meisburger et al. | 250/310 |
| 5,576,833 A | 11/1996 | Miyoshi et al. | 356/394 |
| 5,578,821 A | 11/1996 | Meisberger et al. | 250/310 |
| 5,612,535 A | 3/1997 | Wang | 250/310 |
| 5,763,893 A | 6/1998 | Nakasuji | 250/492.2 |
| 5,808,310 A | 9/1998 | Yamashita et al. | 250/492.22 |
| 5,986,263 A | * 11/1999 | Hiroi et al. | 250/310 |
| 6,011,262 A | * 1/2000 | Hamashima et al. | 250/310 |

FOREIGN PATENT DOCUMENTS

| | | |
|---|---|---|
| JP | 4-242060 | 8/1992 |
| JP | 5-109381 | 4/1993 |
| JP | 8-212955 | 8/1996 |
| JP | 10-12178 | 1/1998 |

OTHER PUBLICATIONS

Article entitled "Simulation of a Wien filter as beam separator in a low energy electron microscope" copyright 1994 Elsevier Science B.V.; K. Tsuno.

* cited by examiner

Primary Examiner—Kiet T. Nguyen
(74) Attorney, Agent, or Firm—Erik B. Cherdak & Associates, LLC (57) ABSTRACT

Electron beam type inspection device for generating images of specimens (e.g., silicon wafers, etc.) includes an electron gun which emits an electron beam, an electron beam optical system which causes the electron beam to form an irradiation region on a surface of a specimen, a detector which detects at least one of second order electrons and reflected electrons reflected by the irradiation region, a projection optical system projecting the second order electrons and the reflected electrons onto a detection surface within the detector. The second order electrons and the reflected electrons correspond to an observation region within the irradiation region. The inspection device also includes a magnification controller which controls the size of the observation region and the magnification of the projection optical system, and an irradiation controller which controls the current density of the irradiation region based on the size of the observation region. Also provided is a method of making a corresponding inspection device which includes steps of providing and assembling the aforementioned component parts.

20 Claims, 12 Drawing Sheets

ELECTRON BEAM TYPE INSPECTION DEVICE AND METHOD OF MAKING SAME

BACKGROUND OF THE INVENTION

1. Field of the Invention

The present invention relates to inspection devices such as electron microscopes which are used to generate images of specimens (e.g., silicon wafers, etc.) using electron beams. More particularly, the present invention relates to systems and methods used to affect imaging time and image brightness and contrast characteristics within such inspection devices.

2. Description of the Related Art

Electron beam type inspection devices such as scanning electron microscopes are well known. Typically, such devices generate images of specimens (e.g., silicon wafers, etc.) by causing a focused electron beam projected in the form of a spot to scan a specimen surface to allow detection of reflected and other second order electrons. For example, such scanning electron beam type inspection devices are used during integrated circuit and corresponding silicon wafer production and processing.

Despite their widespread use, conventional scanning electron beam type inspection devices such as electron microscopes are not without their problems. For example, because conventional scanning electron microscopes scan specimens with an electron beam projected in the form of a spot having a relatively narrow diameter, substantial time was required to detect reflected and other second order electrons and to generate corresponding sample images. And, unfortunately, when detection times were shortened by improvements in devices to increase beam scanning speeds, the quantity of electrons emitted/detected per picture was reduced. Such reduction in the quantity of emitted/detected electrons brought about the corresponding problem of a reduction in image brightness and contrast.

Figure 1:
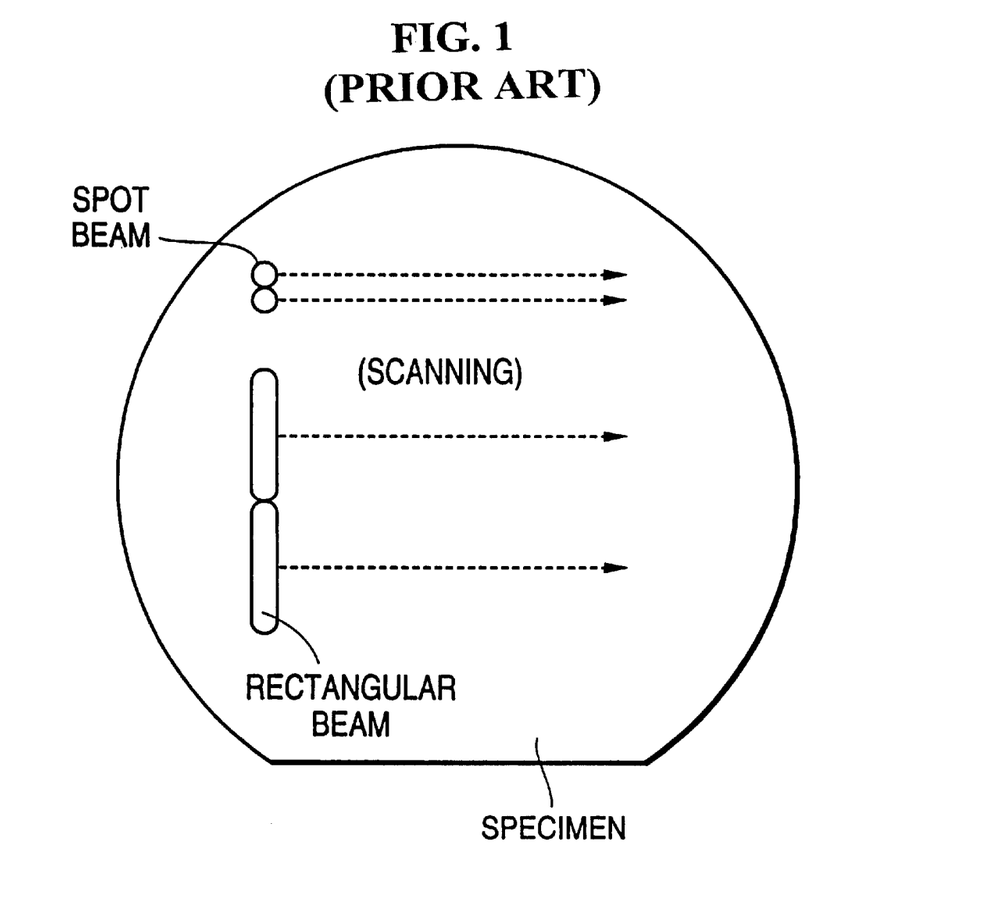
FIG. 1 is a diagram that illustrates scanning operations of an inspection device which generates a rectangular beam spot according to the prior art as discussed above in the background of the invention section of this patent document.

To address the aforementioned problems, various devices and methods have been proposed. For example, detection devices which aim to reduce detection times such as during specimen defect detection were proposed in Japanese Laid-Open Patent Nos. 7-181297 (U.S. Pat. No. 5,498,874) and 7-249393 (U.S. Pat. No. 5,576,833). With such detection devices, an electron beam emitted from a rectangular cathode is irradiated on the surface of a specimen after being formed by plural multi-polar lenses into a rectangular or elliptical cross sectional shape. As shown in a drawing figure identified as "FIG. 1" which is attached to this patent document, a beam spot of rectangular shape allows for relatively shorter scan times relative to a particular specimen (e.g., a silicon wafer, etc.) as compared to conventional spot-form electron beam type devices since more surface area was covered with each successive scan. Unfortunately, although such improved detection devices have significantly reduced detection times because beam spots have increased in extent (size and shape), they have not fully addressed other problems associated with scanning specimens such as controlling detected image brightness and contrast.

Thus, there exists a need to solve the aforementioned problems associated with prior electron beam type inspection devices and to provide new and improved electron beam type imaging devices such as new and improved scanning electron microscopes. To be viable, such new and improved electron beam imaging devices must allow for fast scanning times and the generation of images having constant brightness and contrast characteristics.

SUMMARY OF THE INVENTION

In view of the aforementioned comments concerning the problems associated with prior electron beam type inspection devices, the present invention provides an inspection device which allows for faster picture detection and which is capable of producing images having normal and constant brightness and contrast characteristics regardless of observation magnification, etc. As such, users of electron beam type inspection devices can now take advantage of the present invention to produce images (e.g., such as silicon wafer surface defect images, etc.) without having to realize poor image qualities that often resulted from use of prior devices.

The present invention solves the aforementioned problems and provides the above-stated benefits by providing new and improved electron beam type inspection devices that allow for fast scan times and which are capable of producing images of samples that have normal and constant brightness and contrast characteristics. For example, according to one aspect of the present invention, provided is an inspection device that includes an electron gun which emits an electron beam, an electron beam optical system which causes the electron beam to form an irradiation region on a surface of a specimen, a detector which detects at least one of second order electrons and reflected electrons reflected by the irradiation region, and a projection optical system projecting the second order electrons and the reflected electrons onto a detection surface within the detector. The second order electrons and the reflected electrons correspond to an observation region within the irradiation region. The inspection device also includes a magnification controller which controls the size of the observation region and the magnification of the projection optical system, and an irradiation controller which controls the current density or intensity of the irradiation region based on the size of the observation region.

According to another aspect of the present invention, provided is an inspection device that includes an electron gun which emits an electron beam, an irradiation electron optical system which irradiates the electron beam to an irradiation region on a surface of a specimen, an electron detector which detects at least one of second order electrons and reflected electrons which are generated by the irradiation region, and a projection optical system which projects to a detection surface within the electron detector an observation region within the irradiation region on the specimen to cause imaging of the observation region. The observation region corresponds to a second order beam which includes at least one of the second order electrons and the reflected electrons. The projection optical system is disposed between the specimen and the electron detector. The inspection device also includes a magnification controller coupled to the projection electron system and which changes the size and area of the observation region on the specimen surface and which changes the projection magnification of the projection optical system. The inspection device also includes an electron irradiation controller coupled to the irradiation electron optical system and which changes the current density and intensity of the irradiation region according to the size and area of the observation region. The electron detector adjusts electron detection sensitivity based on the projection magnification set by the magnification controller.

And, according to another aspect of the present invention, provided are methods of making inspection devices as described above. Such methods include steps of providing and assembling the aforementioned component parts to make corresponding inspection devices.

BRIEF DESCRIPTION OF THE DRAWING FIGURES

The present invention is described below with reference to the following drawing figures, of which:

FIGS. 9(1) and 9(2) are diagrams that illustrate the operation of a TDI array type CCD sensor which may be deployed in an inspection device provided in accordance with a third preferred embodiment of the present invention;

DETAILED DESCRIPTION OF THE PREFERRED EMBODIMENTS

The present invention is now discussed with reference to the drawing figures that were briefly described above. A discussion of each preferred embodiment of the present invention is followed by a corresponding discussion of its operation. Unless otherwise specified, like parts are referred to with like reference numerals.

Figure 2:
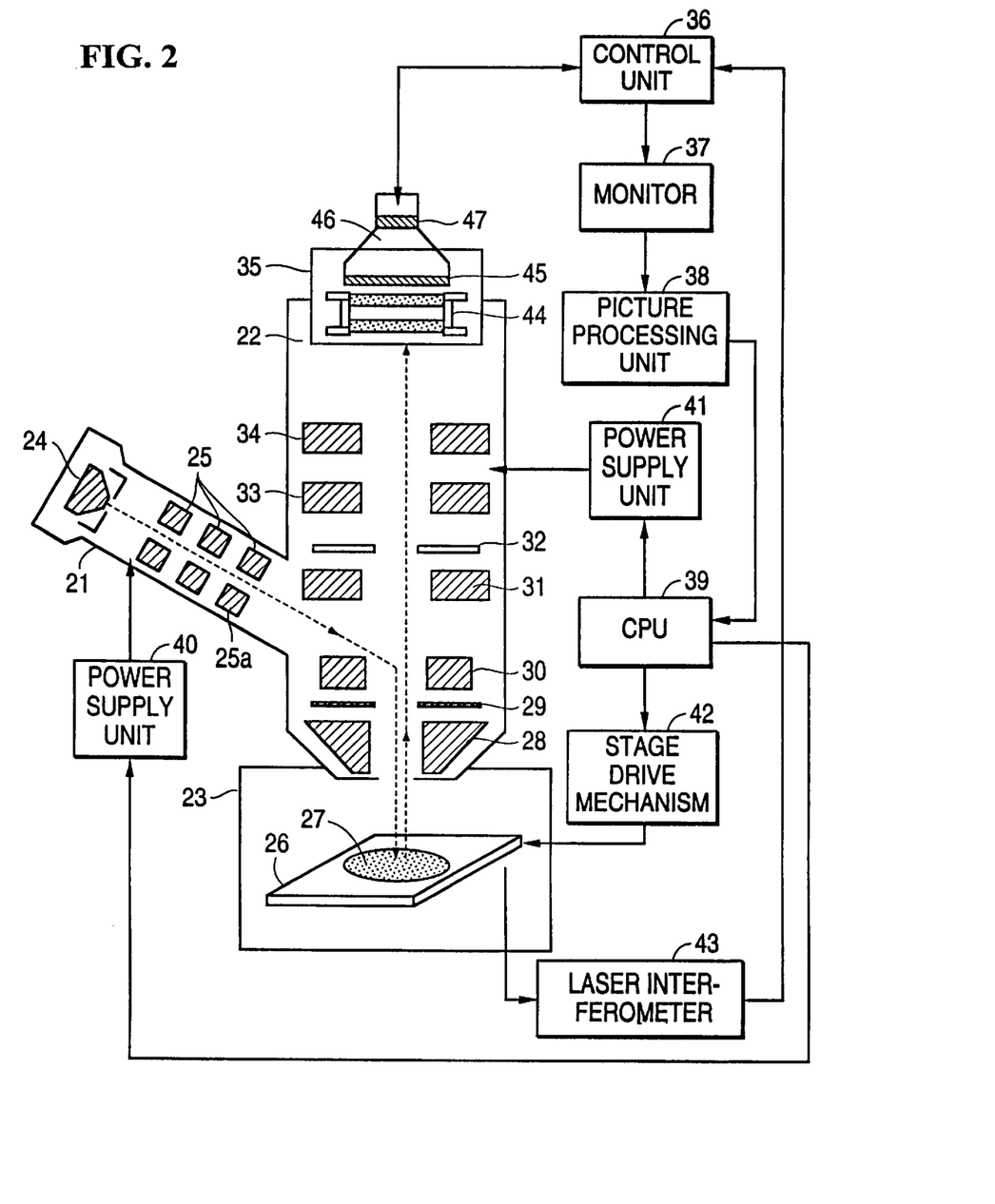
FIG. 2 is diagram of an inspection device according to a first preferred embodiment of the present invention.
Figure 3:
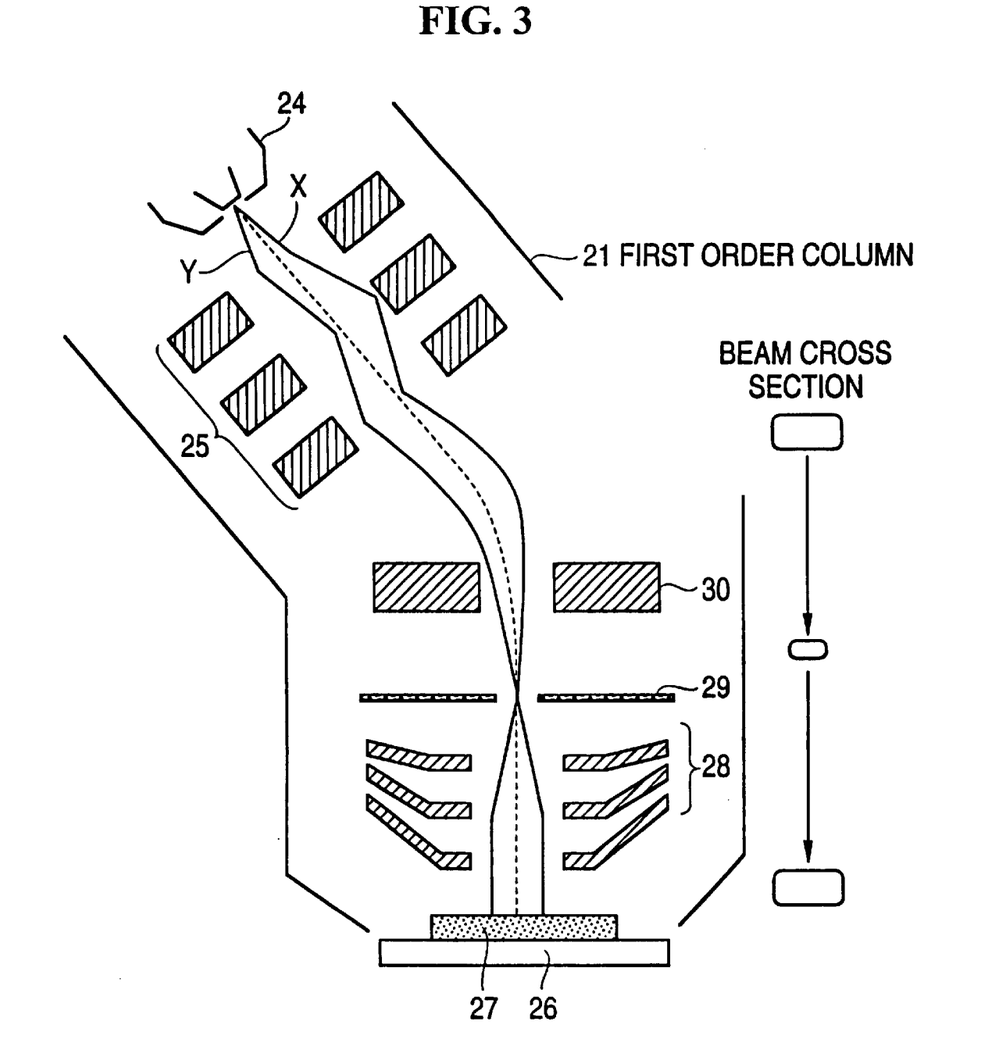
FIG. 3 is a diagram that illustrates the emission trajectory of an electron beam (e.g., a first order beam) within the inspection device depicted in FIG. 2.
Figure 4:
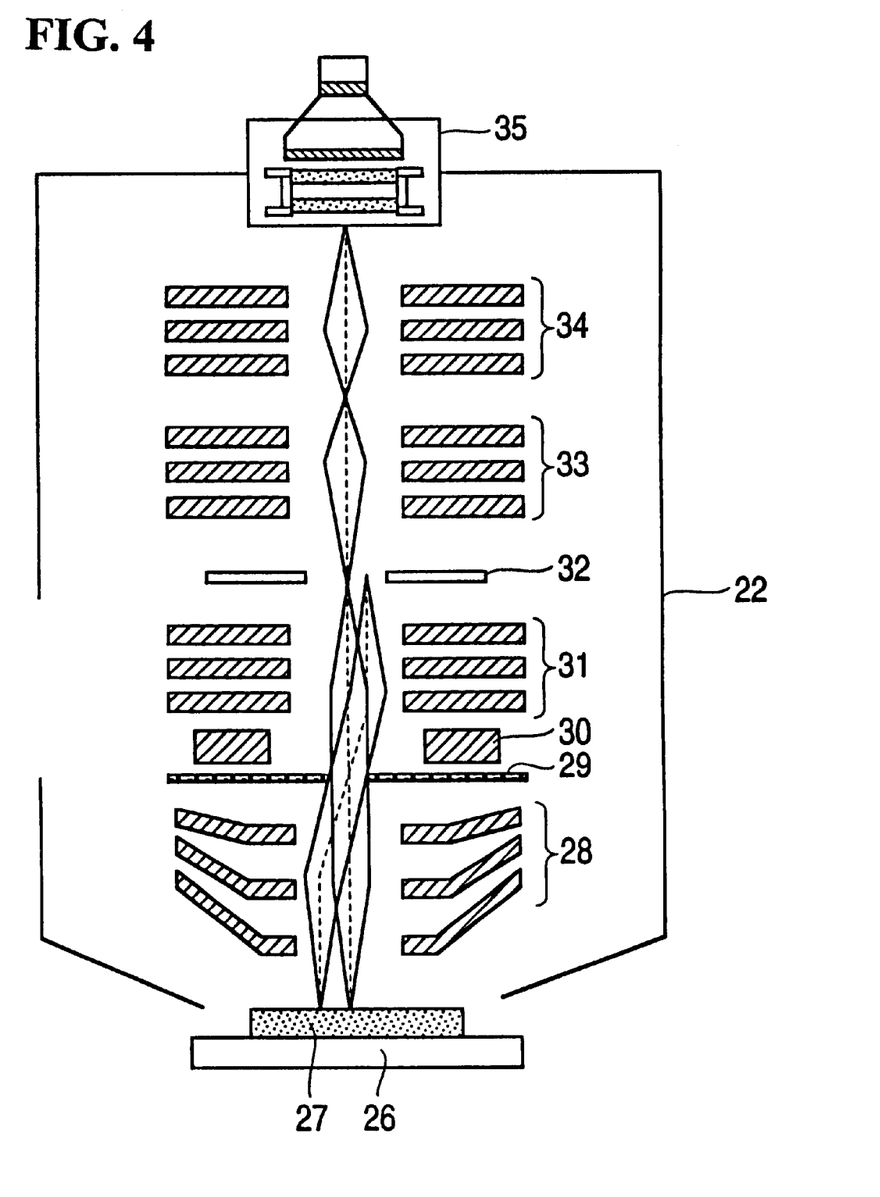
FIG. 4 is a diagram that illustrates the reflection trajectory of an electron beam (e.g., a second order beam) within the inspection device depicted in FIG. 2.

Referring now to FIGS. 2–4, depicted therein is a diagram of an electron beam type inspection device such as a scanning electron microscope according to a first preferred embodiment of the present invention. FIGS. 3 and 4 are diagrams that illustrate the emission and reflection trajectories of electron beams within the inspection device depicted in FIG. 2. In FIGS. 2–4, the inspection device depicted therein has a first order column, a second order column 22, and a chamber 23. A thermionic emission type electron gun 24 is disposed in the first order column 21. A first order optical system 25 is arranged along an optical axis corresponding to an emitted electron beam (i.e., a first order beam). A stage 26 is arranged in chamber 23, and a specimen (e.g., a silicon wafer, etc.) 27 is positioned for inspection on stage 26.

Within second order column 22, a cathode lens 28, an aperture stop, a Wien filter 30, a second lens 31, a field stop unit 32, a third lens 33, a fourth lens 34, and a detector unit 35 are arranged along an optical axis of a second order beam which may include second order and reflected electrons reflected by specimen 27. Aperture stop 29 is made from a thin metal film (e.g., such as Mo, etc.) and has an aperture formed therein. More particularly, aperture stop 29 is disc-shaped with a hole formed therein. Field stop unit 32 is arranged in a convergence position of the second order beam and the focal position of cathode lens 28. Cathode lens 28 and aperture stop 29 act as a telecentric optical system.

Detector unit 35 is connected to a control unit 36 which produces an output which, in turn, is input to a picture processing unit 38 via a monitor 37. The output of picture processing unit is input to a data processor device like a CPU 39.

CPU 39 is connected to power supply units 40 and 41 and to a stage movement mechanism 42. Power supply unit 40 supplies a voltage to electron gun 24 and to first order optical system 25. Power supply unit 41 supplies a voltage to cathode lens 28, second lens 31, third lens 33, fourth lens 34, and to stage movement mechanism 42 to drive stage 26 in X and Y directions.

A laser interferometer unit 43 reads the position of stage 26 and transmits stage position information to control unit 36.

First order column 21, second order column 22, and chamber 23 are connected to a vacuum exhaust system (not shown) so that the interior of chamber 23 is kept in an evacuated state, exhausted by the turbo pump of such a vacuum exhaust system.

Detector unit 35 includes an MCP (microchannel plate) 44, a FOP (fiber optical plate) 46 having a fluorescent plate 45, and a detection surface including CCD sensor 47.

The operation of the aforementioned first preferred embodiment is next described. In particular, the paragraphs that follow illustrate the novel features of the present invention when specimen inspection is performed during low and high magnification situations.

Low Magnification Observation

Low magnification observation is achieved when the first order beam from emitted by electron gun 24 becomes incident on Wien filter 30 in accordance with the operation of first order optical system 25. Lanthanum hexaboride ($LaB_6$) is used as a cathode of electron gun 24. $LaB_6$ can output a high current from a rectangularly shaped cathode. Moreover, first order optical system 25 uses rotationally asymmetrical quadruple (or octuple) electrostatic lenses (or electromagnetic lenses). Such lenses are similar to cylindrical type lenses. Accordingly, the long axis of the rectangular cathode (i.e., the X axis) and the short axis (i.e., the Y axis) can respectively bring about convergence and divergence. In FIG. 2, the trajectory of electrons emitted in the X direction cross section and the trajectory of electrons emitted in the Y direction cross section of the rectangular cathode are shown.

Figure 5:
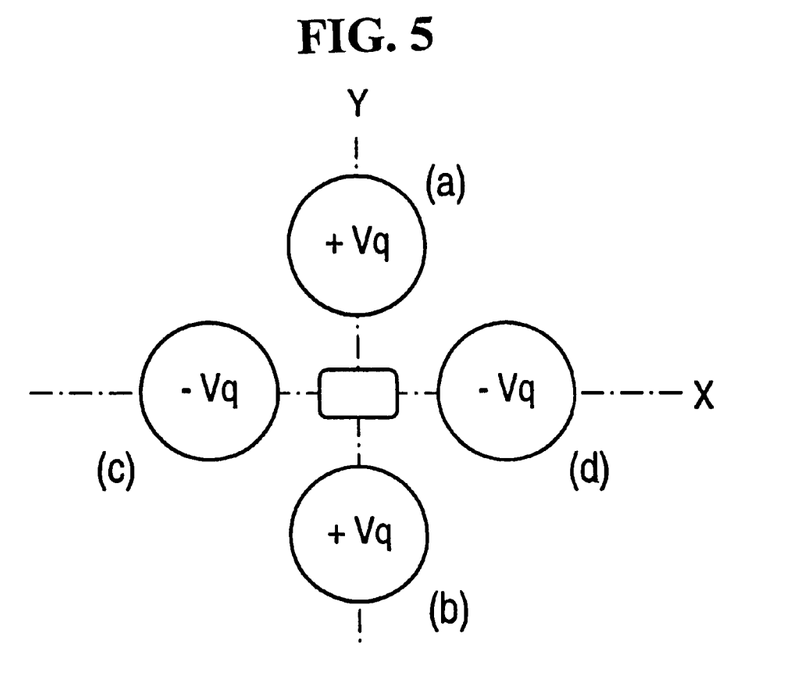
FIG. 5 is a diagram that illustrates an optical system used to control the emission of electrons by an electron gun within the inspection device depicted in FIG. 2.

An exemplary lens arrangement is shown in FIG. 5. In particular, FIG. 5 illustrates a case where an electrostatic lens system is used for first order optical system 25. Such a lens system uses 4 cylindrical rods. Accordingly, setting the facing electrode counterparts to the same potential, they are given mutually reverse voltage characteristics (+Vq at points "a" and "b", −Vq at points "c" and "d"). Such a lens includes three stages. By optimizing the respective lens conditions there is no loss of irradiated electrons. Accordingly, a beam irradiation region on a specimen surface can be optionally formed as a rectangular shape or an elliptical shape, etc. without loss.

The rectangular shaped first order beam formed by first order optical system 25 has a trajectory which is curved by the deflecting action of Wien filter 30, and is imaged at the aperture portion of the aperture stop 29. Wien filter 30, the generated magnetic field, and the electric field are orthogonal. In a case in which the electric field is E, the magnetic field B, and the velocity of charged particles v, only charged particles which satisfy the Wien condition E=vB are propagated rectilinearly. Accordingly, the trajectories of other charged particles are curved.

The aperture stop 29 prevents superfluous electron beams which scatter in the device from reaching the specimen surface and, accordingly, prevents charging up or contamination of specimen 27.

Furthermore, because the aperture stop 29 and the cathode lens 28 constitute a telecentric electron optical system, as shown in FIG. 3, the first order beam which passes through cathode lens 28 becomes a parallel beam, and irradiates specimen 27 uniformly and evenly. As such, Koehler illumination is obtained. At the same time, the beam irradiation region irradiated on the surface of specimen 27 is in proportion to its vertical and horizontal ratio as related to the configuration and surface area of a detection surface using a CCD sensor 47. For example, when a beam irradiation region is 400 μm×200 μm, beam output will be 100 nA in accordance with the present invention.

When the first order beam irradiates specimen 27, a second order beam arises which includes second order electrons and, possibly, other reflected electrons. The second order beam, in essence, carries 2-dimensional picture information of the beam irradiation region of specimen 27. Because the first order beam is irradiated perpendicular to specimen 27, the second order beam has a distinct electron image with no shadows. The second order beam passes through cathode lens 28 without being affected by lens action.

Cathode lens 28 includes 3 electrodes. Normally, in performing lens action, voltage is applied to the first and second electrodes from the bottom of cathode lens 28, and the third electrode is set to a zero potential. The lowest electrode, forming a positive electric field with respect to the potential on specimen 27, is designed to guide electrons within the lens with good efficiency, thus attracting electrons and, in particular, secondary electrons of low directivity.

On the other hand, the aperture stop 29 is located in the focus position of cathode lens 28 and, in particular, in the back focus position relative to specimen 27. Accordingly, as shown in FIG. 4, a beam which emerges outside of a field center (i.e., one that is off-axis), consisting of parallel beams, passes through without any shading resulting. Furthermore, aperture stop 29, with respect to the second order beam, plays the part of suppressing lens aberration of second lens 31 through fourth lens 34.

The second order beam which passes through aperture stop 29 does not receive a deflecting action as normally caused by Wien filter 30, and passes through unchanged in a straight line. Accordingly, by changing the magnetic field applied to Wien filter 30, electrons having a specific energy (for example, secondary electrons or reflected electrons) from the second order beam can pass through to detector unit 35.

When the second order beam is used for imaging in accordance with cathode lens 28 only, lens action is strong and tends to give rise to aberration. Consequently, combining cathode lens 28 with second lens 31, a single performance of imaging is realized. The second order beam gives an intermediate image on filter aperture 32 in accordance with cathode lens 28 and second lens 31.

Because it is frequently the case that the necessary enlargement magnification is insufficient within only two lens systems, intermediate images may be enlarged according to the present invention by the addition of third lens 33 and fourth lens 34. The second order beam, enlarged and imaged respectively by third lens 33 and fourth lens 34, produces a total of 3 images. Furthermore, third lens 33 and fourth lens 34 may be combined to produce a single image.

Second lens 33 through fourth lens 34 are rotationally and axially symmetrical type lenses. That is, such lenses are uniaxial lenses or einzel type lenses. Each lens includes 3 electrodes. Normally the outside two electrodes are set to a zero potential, and the lens action is changed by changing the voltage applied to the third electrode.

The field stop unit 32 is located in the intermediate image point, but such field stop, similarly to the field stop of an optical microscope, limits the field to the necessary extent. In particular, in the case of an electron beam, the third lens and the fourth lens prevent charging up or contamination of detector unit 35.

As the second order beam passes through second lens 33 and third lens 34, images are produced on a detection surface of detector unit 35. With reference to the example mentioned above, an image of the aforementioned beam irradiation area of 400 μm×200 μm is projected on the detection surface. Accordingly, the second order beam, incident on the MCP 44, amplifying its amount of current within the MCP 44, impinges on the fluorescent plate 45. The electrons are converted into an optical image on the fluorescent plate 45. The optical image passes through FOP 46, and is imaged by CCD sensor 47. In order to match the picture size in the fluorescent plate 45 and the image size of the CCD sensor 47, the projection is reduced in FOP 46.

The optical image is photo-electrically converted by CCD sensor 47. Control unit 36 reads the picture information serially from CCD sensor 47, and outputs the same to monitor 37 and image processing unit 38. Image processing unit 38 can be used to detect defective places of a pattern, for example, by pattern matching, etc. with respect to the detection picture. Accordingly, control unit 36 and picture processing unit 38 in conjunction with monitor 37 form an imaging system that facilitates display and manifestation of images of an observation of an inspected specimen.

CPU 39 can output drive control signals to stage drive mechanism 42 to cause movement of the same. For example, a defective place or spot on a specimen surface can be positioned near the center of monitor 37 for optimal viewing.

High Magnification Observation

Figure 6:
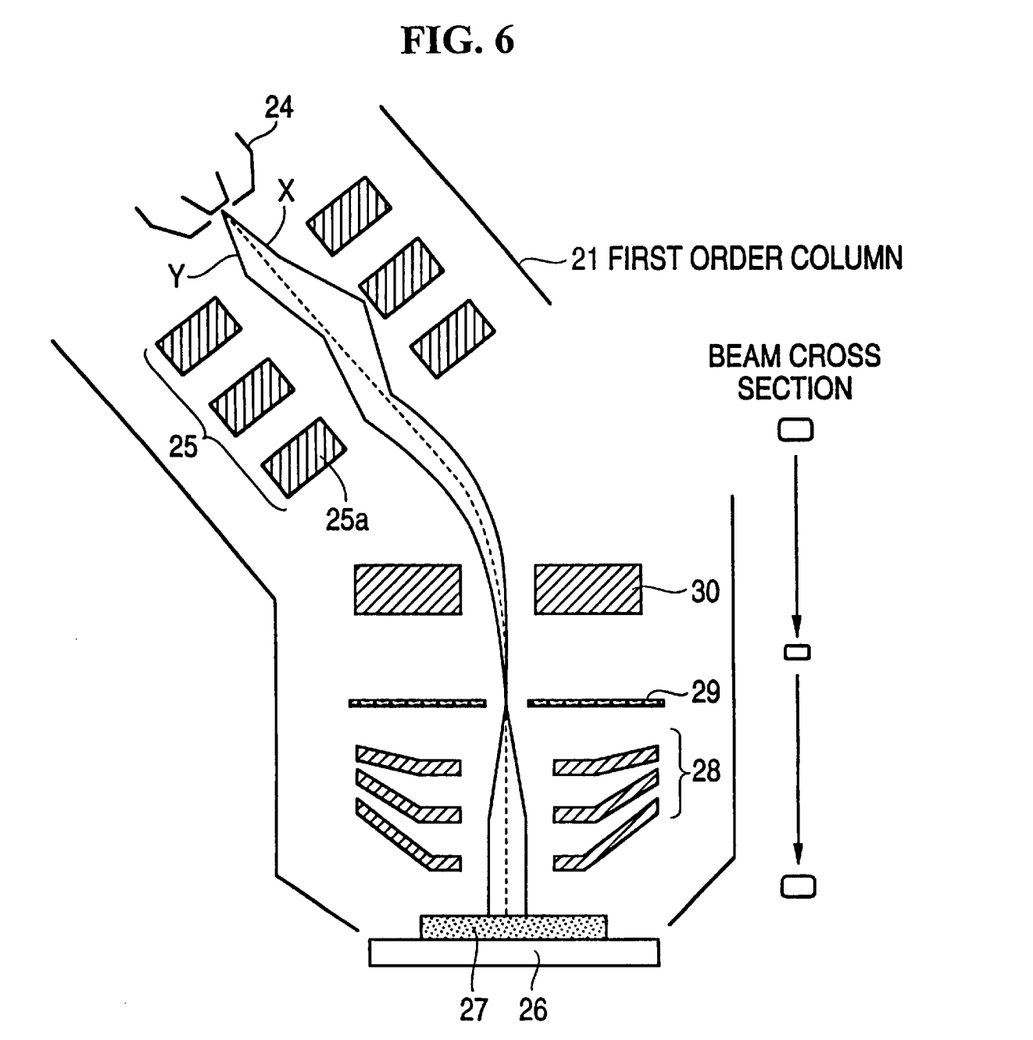
FIG. 6 is a diagram that illustrates the emission trajectory of an electron beam (e.g., the first order beam) within the inspection device depicted in FIG. 2 during high magnification observation.

By changing the observation magnification from low magnification to high magnification, a detected defective portion of a specimen, for example, may be enlarged and observed. For example, in observation at high magnification, observation is possible in a region of 200 μm×100 μm. At this time, the beam diameter is stepped down, and the beam irradiation region is narrowed from 400 μm×200 μm to 200 μm×100 μm. Specifically, as shown in FIG. 6, power supply unit 40, according to control signals output by CPU 39, with respect to the lens 25a located near Wien filter 30 of first order optical system 25, makes the value of the applied voltage Vq smaller. At the time of low magnification observation, an electron beam of 100 nA was irradiated in an observation region of 400 μm×200 μm, but in high magnification observation, an electron beam of 100 nA is irradiated in an observation region of 200 μm×100 μm. Accordingly, even when the observation magnification increases, the beam irradiation region narrows to match the observation region, and because of high control of the current density and intensity of the beam irradiation region, a reduction of the image brightness and contrast does not result.

Figure 7:
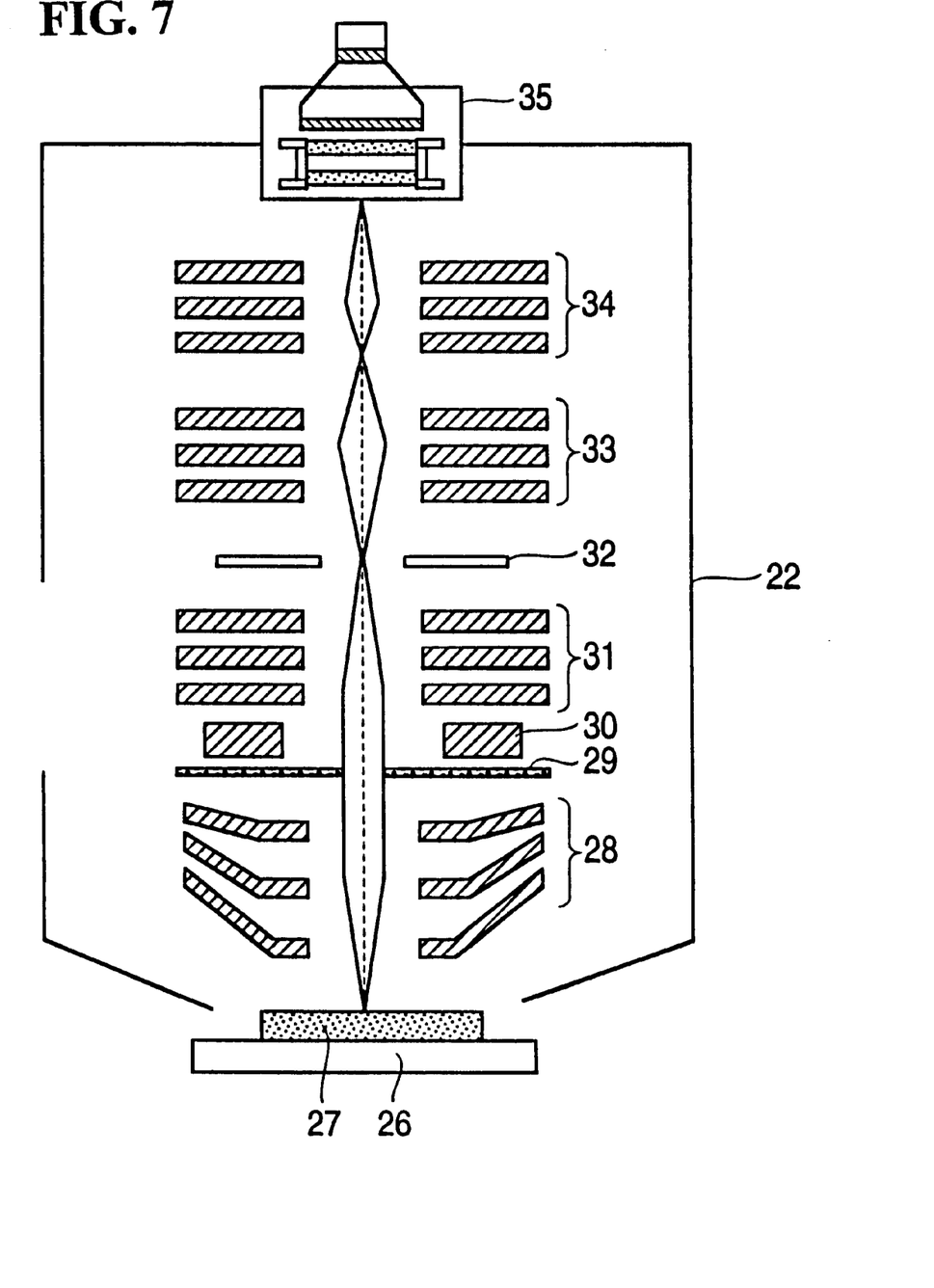
FIG. 7 is a diagram that illustrates the reflection trajectory of an electron beam within the inspection device depicted in FIG. 2 during high magnification observation.

On the other hand, in the second order optical system, enlarging the projection area changes the focal distance of third lens 33 and fourth lens 34. Specifically, the absolute value of the voltage applied to the center electrode of the third lens 33 is reduced, and the focal distance of the lens is lengthened. As such, the second order beam does not image on the detection surface of detector unit 35. Consequently, the absolute value of the voltage applied to the center electrode of fourth lens 34 is increased, causing imaging on the detection surface. As shown in FIG. 7, the second order beam which images 7 on the detection surface of detector unit 35, increases the observation magnification, causing a smaller angular spread with respect to fourth lens 34.

Increasing the observation magnification causes the beam irradiation region to become narrow. As such, current density of the beam irradiation region markedly increases. When the current density exceeds a fixed amount, contamination or charging up of specimen 27 tends to occur. Consequently, CPU 39 calculates the current density in the beam irradiation region from the area of the beam irradiation region and the beam output. Then, on exceeding a predetermined current density, even if the observation magnification is increased, a narrowing of the beam irradiation region according to such an increased observation magnification is interrupted, and an excessive increase of the current density in the beam irradiation region is avoided.

Moreover, when the observation magnification is changed, changing the lens conditions of the second order optical system, the lens conditions of the first order optical system are set such that the observation region on the specimen surface, and the irradiation region of the electron beam, become the same size. As such, the alteration of the brightness and contrast of the image (for example, a decrease in image brightness when the observation magnification is increased) due to changing the observation magnification can be suppressed. That is, if the observation magnification is increased, the observation region narrows. As such, when an electron beam is projected as an enlargement by the second order optical system, the signal density of detection electrons is normally kept constant, and a reduction of the brightness and contrast of the image can be avoided.

Figure 8:
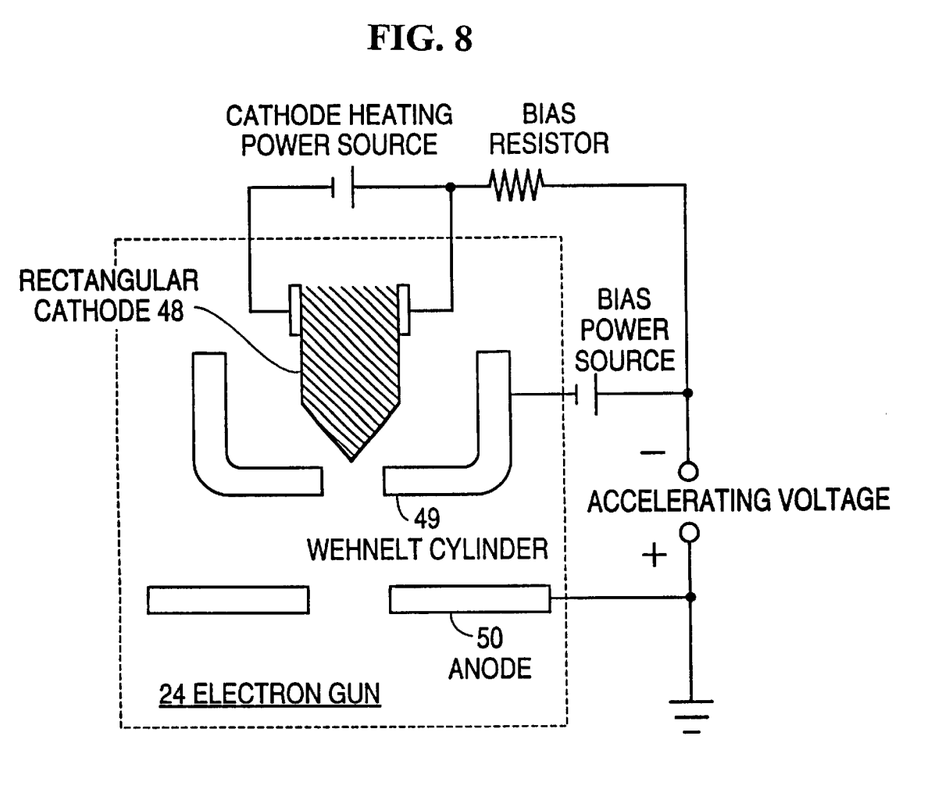
FIG. 8 is a diagram that illustrates an electron gun arrangement according to a second preferred embodiment of the present invention.
Figure 9:
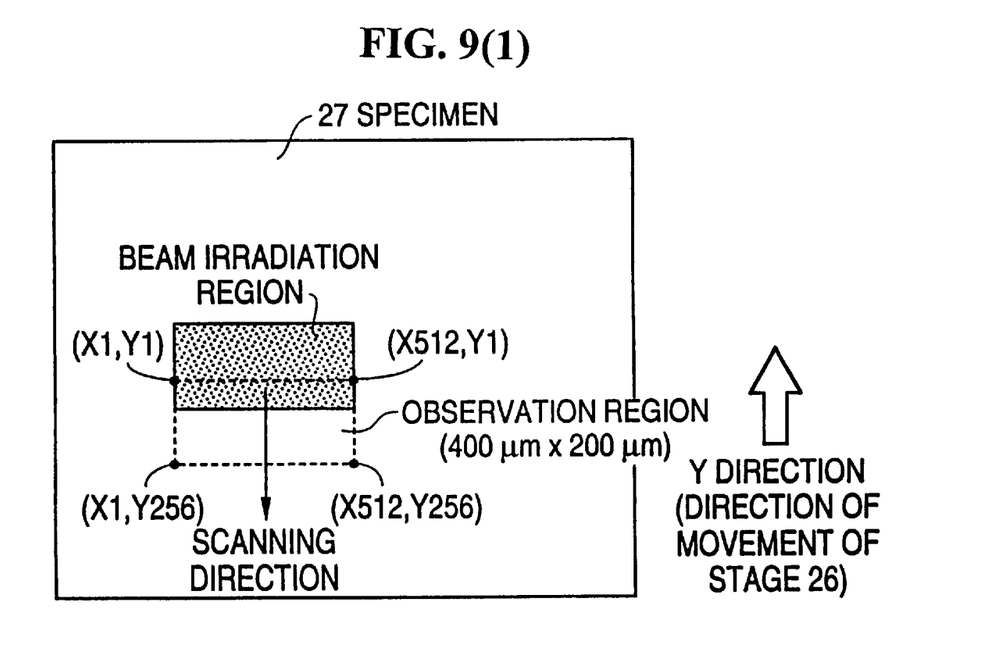

Referring now to FIG. 8, depicted therein is a second preferred embodiment of an electron gun according to the present invention. Many structures within the second preferred embodiment are the same as those described in regard to FIGS. 2–4. Accordingly, for purposes of brevity, a detailed description of the same structures are omitted.

In the second preferred embodiment of the present invention as now described with regard to FIG. 8, the output of electron gun 24 is controlled according to observation magnification (e.g., the extent of the observation region). Electron gun 24 includes a rectangular cathode 48, a Wehnelt cylinder 49, and an anode 50. Anode 50 is grounded, and a positive accelerating voltage is applied thereto. Moreover, a high negative voltage for acceleration is applied to rectangular cathode 48 by means of a bias power supply. Rectangular cathode 48 emits electrons heated by means of a cathode heating power supply/source and are accelerated up to a required acceleration voltage by means of anode 50.

Accordingly, when observation magnification is increased, CPU 39 (FIG. 2) outputs a control signal to power supply unit 40. Power supply unit 40, in turn, controls the output of the electron beam by changing the accelerating voltage applied to anode 50. For example, in order to reduce the brightness of a picture when increasing the observation magnification, the electron beam output is increased thus lessening the bias of electron gun 24. Moreover, when the observation magnification is decreased, the bias of electron gun 24 is increased and a change in picture brightness is suppressed thus maintaining constant brightness and contrast. However, it is noted that increases in observation magnification may cause the current density of the beam irradiation region to be markedly increased. When such current density exceeds a fixed amount, there is a tendency for contamination or charging up of specimen 27 to occur. Consequently, CPU 39 calculates the current density in the beam irradiation region from the area of the beam irradiation region and the beam output. Then, on exceeding a fixed current density, even if the observation magnification is increased, a rise of the beam output beyond the aforementioned fixed amount is interrupted, and an excessive increase of the current density in the beam irradiation region is avoided.

Accordingly, by controlling the electron beam output of the electron gun 24 as in the context of the aforementioned and described second preferred embodiment, changes in brightness and contrast of a picture due to changes in observation magnification are avoided.

Referring now to FIGS. 9(1), 9(2), and 10 depicted therein are charts and diagrams of structures that correspond to a third preferred embodiment of the present invention which is next described. In such a third preferred embodiment, brightness changes are suppressed by detector unit 35. Many of the structures included within the third preferred embodiment of the present invention are the same as those illustrated in FIGS. 2–4. Accordingly, for purposes of brevity, detailed descriptions of the same are omitted. Instead, the following paragraphs discuss the alternative structures and operations that make up the third preferred embodiment of the present invention. In particular, a TDI (Time Delay Integration) array type CCD sensor is used in place of CCD sensyor 47.

Figure 10:
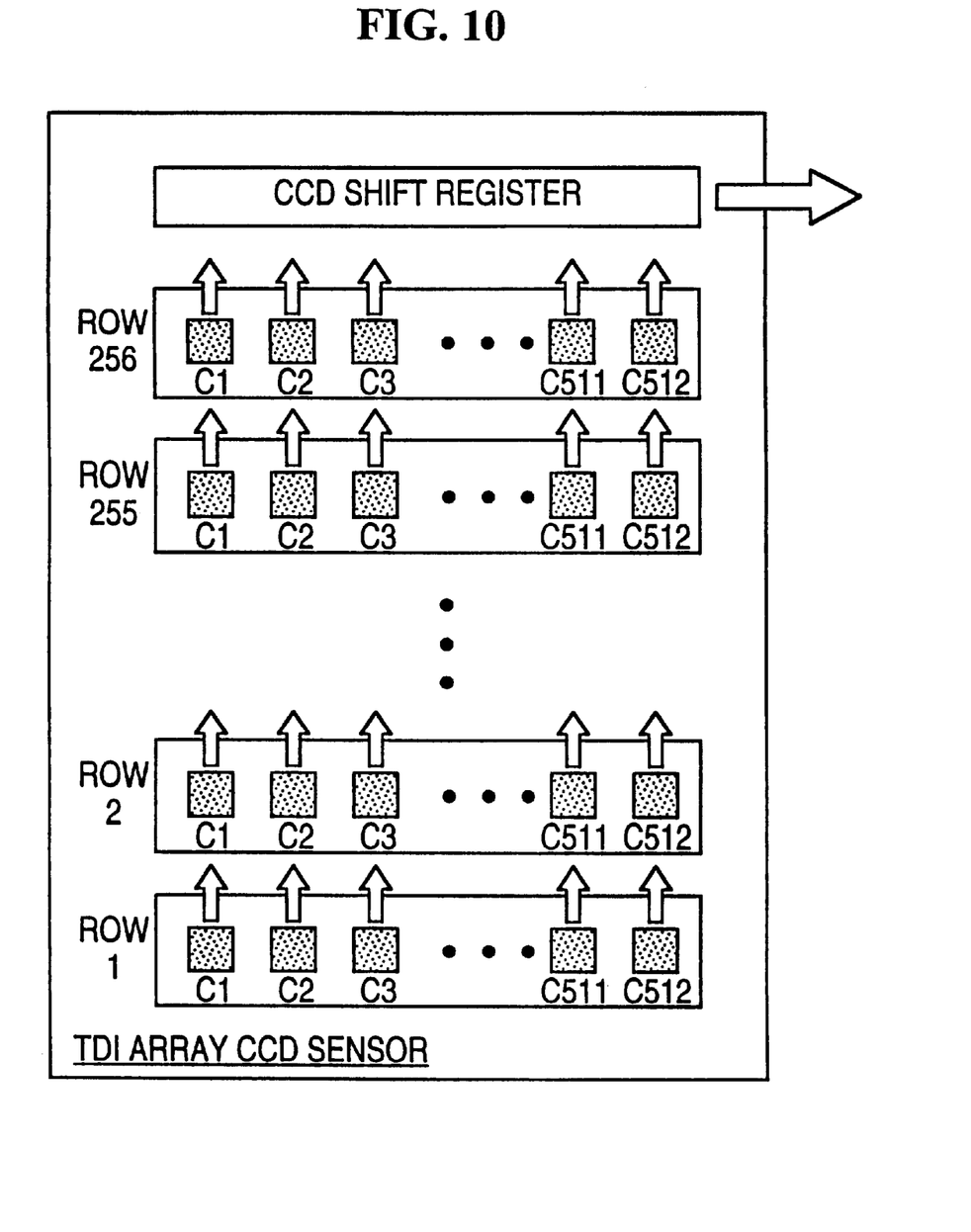
FIG. 10 is a block diagram of a TDI array type CD sensor in accordance with the third preferred embodiment of the present invention illustrated in FIGS. 9(1) and 9 (2)

With specific reference to FIGS. 9(1), 9(2) and 10, the operation of an inspection device that is outfitted with a TDI type CCD sensor is next described. As shown in FIG. 9(1), a region from (X1, Y1) to (X512, Y256) (400μ×200 μm) is set as the observation region during low magnification observation. The TDI array CCD sensor, for example, has a 512×256 pixel arrangement (e.g., picture elements arranged in rows or other imaging segments). The observation region is projected by the second order optical system so as to conform to the TDI array CCD sensor.

Next, the picture of the observation region from (X1, Y1) to (X512, Y1) is time imaged by means of the TDI array CCD sensor. The signal charges are stored in ROW 1 of the TDI array CCD sensor shown in FIG. 10. CPU 39 (FIG. 2) outputs a drive control signal to stage drive mechanism 42 which drives stage 26 in the Y direction. Thereafter, the beam irradiation region moves in the scan direction by one horizontal scan line of the TDI array CCD sensor. Simultaneously, laser interferometer 43 sends a vertical clock signal to control unit 36.

When control unit 36 inputs the aforementioned vertical clock signal, it sends a transfer pulse which transfers the signal charge stored in ROW 1 to ROW 2. The picture from (X1, Y1) to (X512, Y1) is imaged in ROW 2 and signal charge is stored by adding the signal charge which was transferred from ROW 1. Next, the picture from (X1, Y2) to (X512, Y2) is imaged in ROW 1 which stores newly generated signal charges.

Furthermore, when stage 26 drives a horizontal scan line portion, in ROW 3, the picture is imaged from (X1, Y1) to (X512,Y2), and the signal charge is stored. However, the signal charge from ROW 2 is added and stored. Moreover, in ROW 2, the picture from (X1, Y2) through (X512, Y2) is imaged and stored. The signal charge transmitted from ROW 1 also is added and stored. Moreover, in ROW 1, the picture from (X1, Y3) to (X512, Y3) is imaged and stored.

In the aforementioned manner, by sequentially moving stage 26 in the Y direction, the beam irradiation region scans the observation region, and the TDI array CCD sensor sequentially transfers stored signal charges to adjacent rows. By repeating this operation, imaging of the picture from (X1, Y256) to (X512, Y256) and the number of horizontal scan lines is added and stored in ROW 256 of the TDI array CCD sensor.

In such a state, when a transfer pulse is input to TDI array CCD sensor, the signal charge stored in ROW 256 is transferred, via a transfer gate (not shown), to a CCD shift register. As such, the specimen image is generated one horizontal scan line at a time and is output to monitor 37.

In the aforementioned manner, adding the signal charges of the same place of a specimen up to the number of horizontal scan lines can be accumulated in the TDI array CCD sensor. That is, by repeatedly performing delayed imaging in accordance with stored signal charges, incrementing and cumulatively adding signal charges corresponding to the same place of a specimen up to the number of horizontal scan lines, it is possible to design for an increase of the S/N of the detected picture.

With a TDI array CCD sensor as provided by the present invention, a reduction of the signal charge amount can be compensated by increasing imaging times. As shown in FIG. 9(2), an imaging operation is carried out in similar fashion to that described in regard to FIG. 9(1). During high magnification observation (observation region: 200 $\mu$m×100 $\mu$m), in comparison with low magnification observation (observation region: 400 $\mu$m×200 $\mu$m), the signal charge amount is reduced by ¼. Consequently, CPU 39, by causing the scanning speed to be slowed, makes the transfer interval time longer for the drive control signals which are sent to stage drive mechanism 42. As such, CPU 39 causes the imaging time (charge storage time) to increase by a factor of 4 and thus causes the signal charge amount to correspondingly increase.

In the third preferred embodiment just described, because the charge storage time of the TDI array CCD sensor changes according to the observation magnification, changes of the brightness and contrast of the image due to the observation magnification can be avoided. Moreover, in the present preferred embodiment of the instant invention, compensation for brightness changes are performed by changing the charge accumulation time of a TDI array CCD sensor. The present invention is not so limited, however. To the contrary, an amplifier may be disposed in the output stage of the TDI array CCD sensor whereby its gain may be adjusted to control brightness changes, etc.

Figure 11:
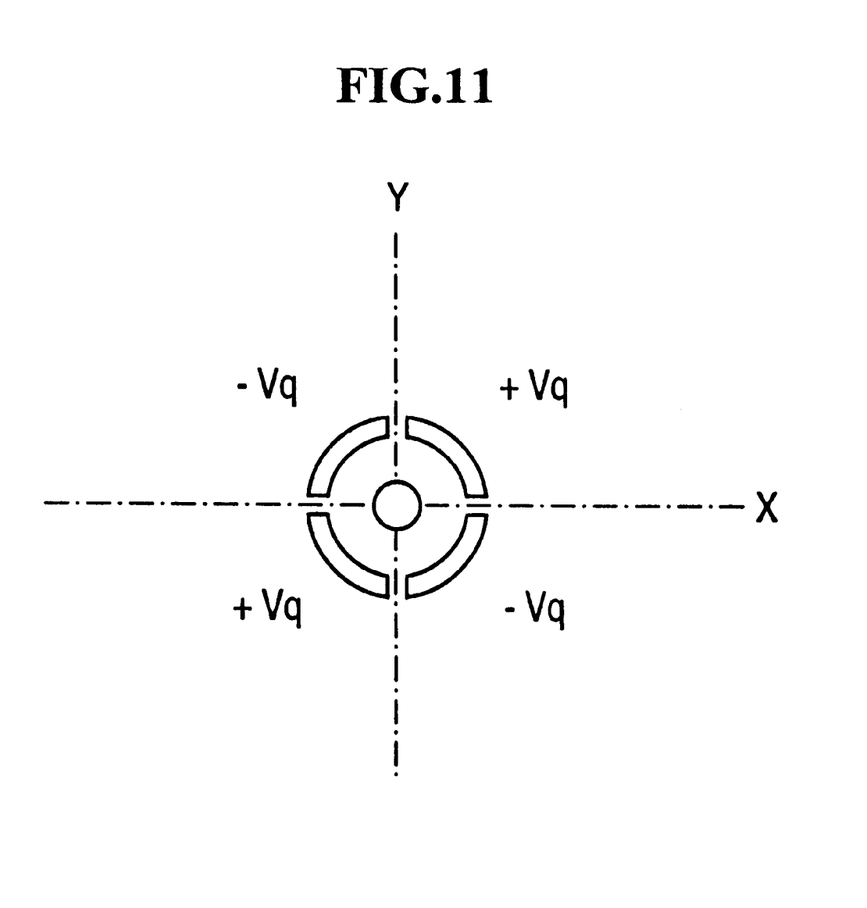
FIG. 11 is a diagram of an alternative first order optical system which may be deployed in an inspection device provided in accordance with the present invention.
Figure 12:
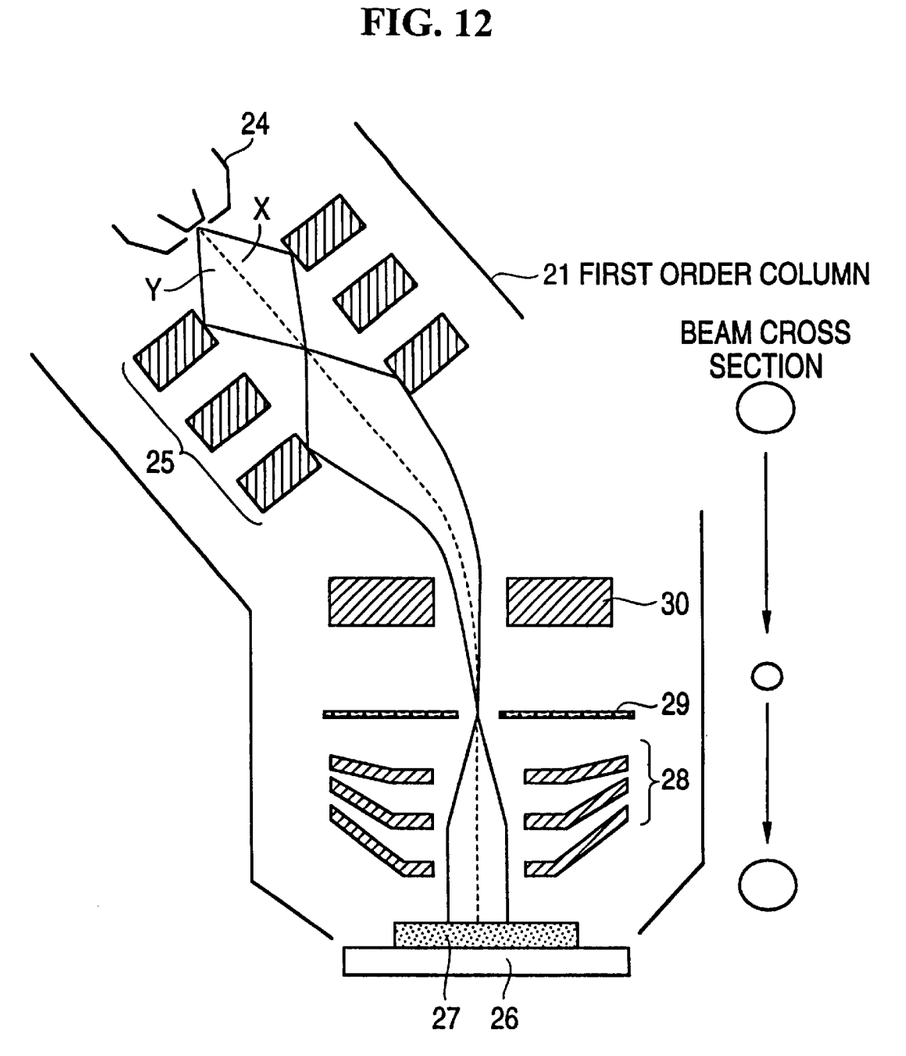
FIG. 12 is a diagram that illustrates an emission trajectory of a first order beam when the optical system depicted in FIG. 11 is deployed in an inspection device in accordance with the present invention.

In the first through third preferred embodiments described above, a rotationally symmetrical quadruple lens is used as the first order optical system 25. The present invention, however, is not so limited. For example, lenses of the rotation axis symmetry type, such as a normal magnetic lenses that use coils, or an einzel-lens type electrostatic lenses, may be used. An example of such an alternative lens system is illustrated in FIG. 11. A small size lens of the type illustrated in FIG. 11 can be designed as shown in FIG. 12. In FIG. 12, because the beam irradiation region is not rectangular but, instead, is cylindrical, its central portion is used for imaging.

Moreover, in the first through third preferred embodiments described above, a change of the focal distance of third lens 33 and fourth lens 34 is performed to thereby change the observation magnification. The present invention is not so limited. To the contrary, a change of focal distance may be performed with two of the four lenses such as with cathode lens 28 and second lens 31.

Furthermore, with the above-described preferred embodiments of the present invention, controlling the current density of a beam irradiation region may be performed by controlling the first order optical system or by controlling the output control of the electron gun. Additionally, a method of avoiding an excessive increase of current density may be performed by narrowing the beam irradiation region and simultaneously reducing the output of the electron beam.

It is important to note that the type of electron gun used within the present invention is not limited to those of the thermionic emission variety. To the contrary, electric field emission type electron guns which use electric field emission from a rectangular cathode may be incorporated. With such alternative type electron guns, high observation magnification may be realized by applying a high voltage to an extraction electrode and to an accelerating electrode.

The present invention as illustrated in FIGS. 2–12 and as discussed above is directed to new and improved electron beam type inspection devices. Such devices may be manufactured to provide the benefits described herein by providing the respective component parts and then assembling the same as shown in the attached drawing figures and as described above to make the same. For example, an inspection device provided by the present invention may be made in accordance with a method that includes the steps of providing an electron gun capable of emitting an electron beam, providing an electron beam optical system capable of causing the electron beam to irradiate an irradiation region on a surface of a specimen, providing a detector configured to detect at least one of second order electrons and reflected electrons reflected by said irradiation region, and providing a projection optical system capable of projecting the second order electrons and the reflected electrons onto a detection surface within said detector so that the second order electrons and the reflected electrons correspond to an observation region within the irradiation region. Such a method also may include the steps of providing a magnification controller capable of controlling the size of the observation region and the magnification of the projection optical system, providing an irradiation controller capable of controlling the current density of the irradiation region based on the size of the observation region, and arranging and assembling the aforementioned component parts to make a corresponding electron beam type inspection device as illustrated in FIG. 2, for example.

The present invention as described above with regard to the preferred embodiments illustrated in FIGS. 2–12 provides certain benefits not heretofore realized by other, prior inspection devices. For example, because an image of an observation region on the surface of a specimen is projected on the detection surface of an electron detection unit, it is possible to acquire images of collective observation regions. Accordingly, a design is possible for image detection at high speed. Moreover, because it is possible to cause the current density of the irradiation region to change according to the extent of an observation region, even if the projection magnification (observation magnification) is caused to change, a change of the brightness and contrast of the picture does not occur, and a picture having normal constant brightness and contrast can be generated.

Furthermore, because beam output of an electron gun can be controlled according to the extent of an observation region, a picture can be generated which has constant brightness and contrast, irrespective of the projection magnification.

Additionally, a reduction in the contrast of a detected picture can be avoided, even when observing a specimen at high magnification.

Moreover, because the current density of the irradiation region can be limited to below a predetermined current density, an excessive rise of current density can be prevented, even when setting the projection magnification to a high magnification. Accordingly, charging up or contamination of a specimen can be prevented.

Additionally, clear pictures with no shadows can be generated because an electron beam now can be caused to irradiate a specimen vertically by means of a Wien filter.

Furthermore, because an image of an observation region of a specimen surface is projected to a detection surface of an electron detection unit, pictures of observation regions can be acquired collectively and at high speed. Moreover, because the detection sensitivity of the electron detection unit can be adjusted according to projection magnification, pictures can be generated which have constant brightness and contrast, irrespective of the projection magnification.

Generally, in an inspection device provided in accordance with the present invention, changes in brightness and contrast of a detected picture due to projection magnification (observation magnification) can be suppressed, and pictures can be generated which have constant contrast and brightness, irrespective of the projection magnification. Accordingly, during detection of defective places on a specimen surface by pattern matching, for example, a decrease in detection accuracy due to changes of contrast can be avoided, and defect detection of high reliability can be realized.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. An inspection device, comprising:
   an electron gun emitting an electron beam;
   an electron beam optical system causing said electron beam to irradiate an irradiation region on a surface of a specimen;
   a detector disposed at a position facing an inspection device to detect at least one of second order electrons and reflected electrons reflected by said irradiation region;
   a projection optical system disposed at a position between said inspection device and said detector, said projection optical system projecting said at least one of said second order electrons and said reflected electrons onto a detection surface within said detector, said at least one of said second order electrons and said reflected electrons corresponding to an observation region within said irradiation region;
   a magnification controller connected to said electron beam optical system, said magnification controller controlling the size of said observation region and the magnification of said projection optical system; and
   an irradiation controller connected to said electron gun, said irradiation controller controlling the current density of said irradiation region based on the size of said observation region.

2. The inspection device according to claim 1, wherein said irradiation controller controls the size of said irradiation region based on the size of said observation region by controlling the converging action of said electron beam optical system.

3. The inspection device according to claim 1, wherein said irradiation controller controls the output of said electron gun based on the size of said observation region.

4. The inspection device according to claim 1, wherein said irradiation controller sets the current density of said irradiation region to a high state when said size of said observation region is reduced.

5. The inspection device according to claim 1, wherein said irradiation controller sets said current density of said irradiation region to a value less than a predetermined current density.

6. The inspection device according to claim 1, further comprising a Wien filter which guides said electron beam to said projection optical system after said electron beam passes through said electron beam optical system, said Wien filter further causing irradiation perpendicular to said specimen surface.

7. The inspection device according to claim 6, further comprising a lens arranged between said specimen and said Wien filter, said magnification controller changing projection magnification by changing the focal distance of said lens and at least two electron lenses included in said projection optical system.

8. The inspection device according to claim 1, further comprising a Wien filter which filters said at least one of said secondary electrons and said reflected electrons and which causes irradiation by said electron beam perpendicular to said specimen surface.

9. The inspection device according to claim 1, wherein said specimen is a wafer and said irradiation region generated by said electron beam optical system corresponds to an area on said wafer.

10. The inspection device according to claim 1, wherein said detector includes a charged coupled device (CCD) type detection component configured to detect said at least one of second order electrons and said reflected electrons.

11. The inspection device according to claim 1, wherein said detector includes a time delay integration (TDI) array type CCD sensor element.

12. The inspection device according to claim 1, further comprising an imaging system coupled to said detector and configured to receive output signals corresponding to said observation region from said detector and to process same for manifestation on a monitor device.

13. A method of making an electron beam type inspection device, comprising the steps of:
   providing an electron gun for emitting an electron beam;
   providing an electron beam optical system for causing said electron beam to irradiate an irradiation region on a surface of a specimen;

providing a detector for detecting at least one of second order electrons and reflected electrons reflected by said irradiation region;

providing a projection optical system for projecting said at least one of said second order electrons and said reflected electrons onto a detection surface within said detector, said at least one of said second order electrons and said reflected electrons corresponding to an observation region within said irradiation region;

providing a magnification controller for controlling the size of said observation region and the magnification of said projection optical system;

providing an irradiation controller for controlling the current density of said irradiation region based on the size of said observation region; and assembling said electron gun, said electron beam optical system, said detector, said projection optical system, said magnification controller, and said irradiation controller to make a corresponding electron beam type inspection device.

14. An inspection device, comprising:

an electron gun which emits an electron beam;

an irradiation electron optical system which irradiates said electron beam to an irradiation region on a surface of a specimen;

an electron detector disposed at a position facing an inspection device and which detects at least one of second order electrons and reflected electrons which are generated by said irradiation region;

a projection optical system disposed at a position between said inspection device and said electron detector, which projects said at least one of said second order electrons and said reflected electrons to a detection surface within said electron detector for producing an observation region within said irradiation region on said specimen to cause imaging of said observation region on said detection surface, said observation region being corresponding to a second order beam which includes at least one of said second order electrons and said reflected electrons, said projection optical system disposed between said specimen and said electron detector;

a magnification controller coupled to said irradiation optical system and to said projection optical system and which changes the area of said observation region on said specimen surface and which changes the projection magnification of said projection optical system; and an electron irradiation controller coupled to said electron gun and to said irradiation electron optical system and which changes the current density of said irradiation region according to said area of said observation region, whereby said electron detector adjusts electron detection sensitivity characteristics based on said projection magnification set by said magnification controller.

15. The inspection device according to claim 14, wherein said electron detector includes conversion means for converting said at least one of said second order electrons and said reflected electrons to light, and an imaging element having a settable charge storage time and which photoelectrically converts said light into imaging signals, and wherein said electron detector adjusts said detection sensitivity characteristics by setting said charge storage time.

16. The inspection device according to claim 15, wherein said imaging element is a charge coupled device.

17. The inspection device according to claim 15, wherein said imaging element is a time delay integration type imaging element having multiple imaging segments.

18. The inspection device according to claim 14, wherein said specimen is a silicon wafer and said irradiation region irradiated by said irradiation optical system is an area on a surface of said silicon wafer, said observation region being included within said area on said surface of said silicon wafer.

19. The inspection device according to claim 14, further comprising an imaging system coupled to said electron detector and configured to receive output signals corresponding to said observation region from said electron detector and to process the same for manifestation on a monitor device.

20. A method of making an inspection device, comprising the steps of:

providing an electron gun for emitting an electron beam;

providing an irradiation electron optical system for irradiating said electron beam to an irradiation region on a surface of a specimen;

providing an electron detector for detecting at least one of second order electrons and reflected electrons which are generated by said irradiation region;

providing a projection optical system for projecting said at least one of said second order electrons and said reflected electrons to a detection surface within said electron detector for producing an observation region within said irradiation region on said specimen to cause imaging of said observation region on said detection surface, said observation region being corresponding to a second order beam which includes at least one of said second order electrons and said reflected electrons, said projection optical system disposed between said specimen and said electron detector;

providing a magnification controller to be coupled to said projection optical system and which is for changing the size of said observation region on the specimen surface and for changing the projection magnification of said projection optical system;

providing an electron irradiation controller to be coupled to said irradiation electron optical system and which is for changing the current density of said irradiation region according to said size of said observation region, said electron detector configured to adjust the electron detection sensitivity based on said projection magnification set by said magnification controller; and assembling said electron gun, said irradiation electron optical system, said electron detector, said projection optical system, said magnification controller, and said electron irradiation controller to make a corresponding inspection device.

* * * * *